United States Patent
Kon et al.

(10) Patent No.: US 6,888,166 B2
(45) Date of Patent: May 3, 2005

(54) SEMICONDUCTOR LIGHT EMITTING DEVICE AND ITS MANUFACTURE

(75) Inventors: Satoshi Kon, Tokyo (JP); Kazuki Takeshima, Tokyo (JP); Junichi Sonoda, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 8 days.

(21) Appl. No.: 10/658,238

(22) Filed: Sep. 9, 2003

(65) Prior Publication Data

US 2004/0191939 A1 Sep. 30, 2004

(30) Foreign Application Priority Data

Mar. 27, 2003 (JP) ........................................ 2003-088181

(51) Int. Cl.[7] .......................... H01L 27/15; H01L 31/12; H01L 33/00
(52) U.S. Cl. ........................................... 257/79; 257/96
(58) Field of Search ............................ 257/79, 96, 80, 257/81, 85

(56) References Cited

U.S. PATENT DOCUMENTS

2004/0104393 A1 * 6/2004 Liu et al. ........................ 257/79
2004/0104395 A1 * 6/2004 Hagimoto et al. .............. 257/79

FOREIGN PATENT DOCUMENTS

| JP | 10-12917 A | 1/1998 |
|---|---|---|
| JP | 2001-189490 A | 7/2001 |

* cited by examiner

Primary Examiner—Phat X. Cao
(74) Attorney, Agent, or Firm—Frishauf, Holtz, Goodman & Chick, P.C.

(57) ABSTRACT

A ball-up preventive layer is formed on a first substrate. A bonding layer made of eutectic material is formed on the ball-up preventive layer. A semiconductor light emitting structure is formed on a second substrate. A first electrode is formed at least partially on the semiconductor light emitting structure. A barrier layer is formed on the first electrode. A metal layer is formed on the barrier layer. The bonding layer and the metal layer are bonded together. The second substrate is removed from the bonded structure. A second electrode is formed on a partial surface area of the semiconductor light emitting structure exposed on a surface of the bonded structure to obtain a semiconductor light emitting device.

10 Claims, 4 Drawing Sheets

US 6,888,166 B2

SEMICONDUCTOR LIGHT EMITTING DEVICE AND ITS MANUFACTURE

CROSS REFERENCE TO RELATED APPLICATION

This application is based on and claims priority of Japanese Patent Application No. 2003-088181 filed on Mar. 27, 2003, the entire contents of which are incorporated herein by reference.

BACKGROUND OF THE INVENTION

A) Field of the Invention

The present invention relates to a semiconductor light emitting device and its manufacture.

B) Description of the Related Art

A semiconductor light emitting device is generally formed by a light emitting diode structure formed on a semiconductor substrate of GaAs, InP or the like. Light emitted in a light emitting layer propagates in an omnidirection. If the substrate is absorptive relative to light emission, light directed to the substrate is absorbed and attenuated. In order to efficiently direct emitted light to an external, such a structure is preferable that prevents light absorption in the substrate.

If a high reflectance plane is inserted between a light emitting layer and a substrate, light directed to the substrate is reflected and can be lead to an external. However, if a high reflectance Al layer or Ag layer is formed on the substrate, it becomes very difficult to epitaxially grow a semiconductor light emitting layer on the high reflectance layer.

A semiconductor light emitting device has been proposed which has such a structure that a semiconductor light emitting layer is bonded a conductive substrate through a high reflectance layer (e.g., Japanese Patent Laid-Open Publication No. 2001-189490 which is incorporated herein by reference).

FIGS. 4A to 4C are cross sectional views illustrating an LED manufacture method proposed in the above-mentioned Publication.

As shown in FIG. 4A, on a tentative or temporary substrate 42 of GaAs or InP, an LED structure 41 of a pn or np junction is grown. The LED structure may be one of various structures such as a homo pn junction structure, a hetero pn junction structure and a double hetero structure. A metal adhesive layer 43 is formed on a permanent substrate 44, made of a material having a high thermal conductivity, such as silicon, GaAs and alumina, the mental adhesive layer functioning as a reflection mirror. The material of the metal adhesive layer is selected from a group consisting of indium, tin, aluminum, gold, platinum, titanium, zinc, silver, palladium, gold-beryllium alloy, gold-germanium-nickel alloy and zinc-tin alloy. The LED structure 41 is bonded to the metal adhesive layer 43 in water, atmospheric air or alcohol and heat treatment is performed.

As shown in FIG. 4B, the tentative substrate 42 is removed by mechanical polishing or chemical etching. Etchant can be made of hydrochloric acid and phosphoric acid. An etch stopper of, for example, InGaP or AlGaAs, may be formed between the tentative substrate 42 and LED structure 41.

As shown in FIG. 4C, predetermined areas of the LED region are exposed and ohmic contact electrodes 411 and 412 are formed. If the metal adhesive layer is made of the same material as that of the ohmic electrode 411, such as gold-beryllium alloy, the metal adhesive layer may be used as the ohmic electrode 411 by etching the LED structure to the metal adhesive layer 43.

Light emitted from the LED structure 41 and directed toward the permanent substrate 44 is reflected at the metal adhesive layer 43 and transmits again through the LED structure 41 to be output to the external. In this manner, an external light emission efficiency can be improved.

If AuZn is used as the material of the metal adhesive layer 43 and ohmic electrode 411, Zn may be diffused into semiconductor so that it becomes difficult to realize an ohmic contact.

Good reflection characteristics are rather incompatible with good ohmic contact. An alloying process is necessary for forming ohmic contact. Morphology of an interface between semiconductor and metal alloy at the ohmic contact may become rough or metal may diffuse to lower the reflectance.

Solder or eutectic may be used for bonding two substrates. In this case, if solder or eutectic impregnates the reflection layer, the reflection characteristics of the reflection layer are degraded. When two substrates are bonded together, solder or eutectic may cause ball-up.

SUMMARY OF THE INVENTION

An object of this invention is to provide a semiconductor light emitting device of a high quality and its manufacture method.

According to one aspect of the present invention, there is provided a method of manufacturing a semiconductor light emitting device, comprising the steps of: (a) preparing a first substrate; (b) forming a ball-up preventive layer on the first substrate; (c) forming a bonding layer made of eutectic material on the ball-up preventive layer to obtain a support substrate; (d) preparing a second substrate; (e) forming a semiconductor light emitting structure on the second substrate; (f) forming a first electrode in at least a partial surface area of the semiconductor light emitting structure; (g) forming a barrier layer on a surface including an upper surface of the first electrode; (h) forming a metal layer on the barrier layer to obtain a device substrate; (i) bonding together the bonding layer of the support substrate and the metal layer of the device substrate to obtain a bonded structure; (j) removing the second substrate from the bonded structure; and (k) forming a second electrode in a partial surface area of the semiconductor light emitting structure exposed on a surface of the bonded structure at the step (j) to obtain the semiconductor light emitting device, wherein: in the step (i), eutectic material of the bonding layer forms eutectic with the metal layer to bond together the support substrate and the device substrate; the ball-up preventive layer prevents ball-up of the bonding layer; and the barrier layer prevents a composition of a material of the first electrode from diffusing into the side of the barrier layer and prevents the eutectic material of the bonding layer from intruding into the first electrode.

With this semiconductor light emitting device manufacture method, the ball-up can be prevented during bonding in the step (i). It is possible to prevent a reflectance of the reflection layer of the semiconductor light emitting device from being lowered by diffusion of the bonding (eutectic) material.

According to another aspect of the present invention, there is provided a semiconductor light emitting device comprising: a substrate; a ball-up preventive layer formed on the substrate; a bonding layer made of eutectic material and formed on the ball-up preventive layer; a metal layer formed on the bonding layer; a barrier layer formed on the metal layer; a first electrode formed on or in the barrier layer; a semiconductor light emitting structure formed on a surface including an upper surface of the first electrode; and a second electrode formed on a partial surface of the semiconductor light emitting structure, wherein: eutectic material of the bonding layer forms eutectic with the metal layer to bond together the bonding layer and the metal layer; the ball-up preventive layer prevents ball-up of the bonding layer; and the barrier layer prevents a composition of a material of the first electrode from diffusing into the barrier layer and prevents the eutectic material of the bonding layer from intruding into the first electrode.

This semiconductor light emitting device can prevent ball-up and loweing in reflectance and has a high quality.

DESCRIPTION OF THE PREFERRED EMBODIMENTS

FIGS. 1A to 1G are schematic cross sectional views illustrating a method of manufacturing a semiconductor light emitting device according to a first embodiment.

Figure 1A:
FIGS. 1A to 1G are cross sectional views illustrating a method of manufacturing a semiconductor light emitting device according to a first embodiment.

Reference is made to FIG. 1A. On both sides of a conductive substrate 11, an Au layer 12 is vapor-deposited and alloyed at 400° C. in a nitrogen atmosphere. For example, the substrate is made of Si doped with n- or p-type impurities at a high concentration. The thickness of the Au layer 12 is 150 to 600 nm for example. With the alloying process, the conductive substrate 11 and Au layer 12 form eutectic and are integrated to form ohmic contact. The Au layer 12 will not therefore be peeled off from the conductive substrate 11. The conductive substrate 11 may be made of material other than Si, such as Cu, having an electrical conductivity and a high thermal conductivity and becoming alloy with Au.

Figure 1E:
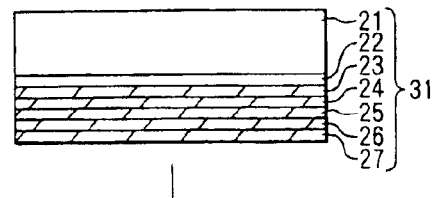
Figure 1B:
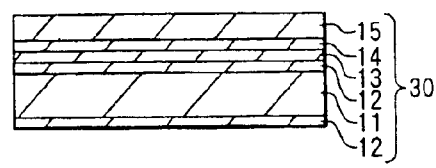

Reference is made to FIG. 1B. On one of the Au layers 12, a Ti layer 13, an Ni layer 14 and an AuSn eutectic layer 15 are sequentially vapor-deposited by an electron beam evaporation method (EB method). The Ti layer 13 is 100 to 200 nm thick, the Ni layer 14 is 50 to 150 nm thick, and the AuSn eutectic layer 15 is 600 to 1200 nm thick. The composition of the AuSn eutectic layer 15 is Au:Sn=about 20 wt %: about 80 wt %. Deposition of the Ti layer 13, Ni layer 14 and AuSn eutectic layer 15 may also be done by resistance heating evaporation or sputtering method, instead of the EB method.

The lamination structure of the conductive substrate 11, Au layer 12, Ti layer 13, Ni layer 14 and AuSn eutectic layer 15 is called a support substrate 30. Since the support substrate 30 has the Ti layer 13 and Ni layer 14, even if the support substrate 30 is heated to about 280° C. (eutectic temperature) at which the AuSn eutectic layer 15 is melted, a ball-up of the AuSn eutectic layer 15 on the support substrate 30 can be prevented. Namely, the Ti layer and Ni layer have a function of preventing the ball-up. The "ball-up" is the phenomenon that AuSn once liquidized at the eutectic temperature or higher is solidified again as the temperature lowers, and during the solidification, AuSn is segregated on the support substrate 30 and locally protrudes upwards.

Instead of the Ni layer 14, an NiV layer may be formed on the Ti layer 13 to prevent the ball-up.

Figure 1F:
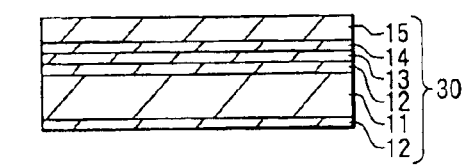
Figure 1C:
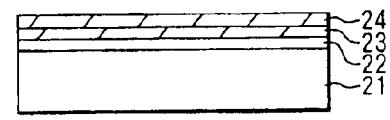

Reference is made to FIG. 1C. A semiconductor substrate 21 such as a GaAs substrate is prepared which can lattice-match a semiconductor light emitting layer capable of emitting light having a target wavelength. A semiconductor light emitting structure 22 is formed on a semiconductor substrate 21. When current is injected into the semiconductor light emitting structure 22, it emits light having a wavelength specific to the semiconductor. The semiconductor light emitting structure 22, for example, includes a quantum well structure. It may also be structured including a homo pn junction, a double hetero (DH) structure or a single hetero (SH) structure. The semiconductor light emitting structure 22 will be described later in detail.

An ohmic electrode 23 is formed on the semiconductor light emitting structure 22. The ohmic electrode 23 is made of metal capable of forming ohmic contact with the semiconductor light emitting structure. For example, if a surface layer of the semiconductor light emitting structure 22 is made of p-type compound semiconductor, e.g., p-AlGaInP, the p-type electrode 23 can be made of AuZn. The ohmic electrode 23 can be formed on the semiconductor light emitting structure 22 by vacuum vapor deposition such as resistance heating evaporation, an EB method and sputtering.

The ohmic electrode 23 of a manufactured semiconductor light emitting device functions also as a reflection layer for reflecting light emitted from the semiconductor light emitting structure 22 and improving the external light emission efficiency of the semiconductor light emitting device.

On the ohmic electrode 23, a conductive diffusion barrier layer 24 is formed, for example, by reactive sputtering method. The diffusion barrier layer 24 is made of Ti—W-nitride for example. The conductive diffusion barrier layer 24 is 100 to 200 nm thick for example. The diffusion barrier layer 24 is required to have a thickness of at least 100 nm. The function of the conductive diffusion barrier layer 24 will be later described.

After the conductive diffusion barrier layer 24 is formed, an alloying process is performed to form good ohmic contact between the semiconductor light emitting structure 22 and ohmic electrode 23. For example, if the surface layer of the semiconductor light emitting structure 22 is made of p-type AlGaInP and the ohmic electrode 23 is made of AuZn, heat treatment for alloying is performed at about 500° C. in a nitrogen atmosphere.

After the alloying process, on the conductive diffusion barrier layer 24, a first intrusion barrier layer 25 made of, for example, Al and a second intrusion barrier layer 26 made of, for example, Ta are vapor-deposited in this order. The thickness of the first intrusion barrier layer 25 made of Al is preferably 600 nm to 1000 nm. Vapor deposition may be EB method, resistance heating evaporation or sputtering. Although different names, the diffusion barrier layer and intrusion barrier layer, are used, both the layers have the same barrier function against diffusing species.

The thickness of the second intrusion barrier layer 26 made of Ta is preferably 100 nm to 200 nm. EB method may be used for vapor deposition. Since Ta is a refractory metal, it is difficult to vapor-deposit it by resistance heating evaporation. By using the EB method, a Ta layer can be formed easily. The second intrusion barrier layer 26 may be made of another refractory metal material such as Mo and W, instead of Ta. The function of the first and second intrusion barrier layers 25 and 26 will be later described.

On the second intrusion barrier layer 26, a low resistivity metal layer 27 made of, for example, Au is formed. A lamination structure of the semiconductor substrate 21, semiconductor light emitting structure 22, ohmic electrode 23, diffusion barrier layer 24, first intrusion barrier layer 25, second intrusion barrier layer 26 and metal layer 27 is called a device substrate 31.

Reference is made to FIG. 1E, the support substrate 30 and device substrate 31 are bonded together by thermocompression bonding (hot press or metal bonding) for example. With the thermocompression bonding method, the support substrate 30 with the eutectic layer 15 and the device substrate 31 are heated to a temperature at which eutectic material melts and pressured to bond the substrates together. They are bonded together by eutectic material (AuSn) contained in the AuSn eutectic layer 15. Bonding is performed by tightly contacting the AuSn eutectic layer 15 and metal layer 27 under the conditions of, for example, a nitrogen atmosphere, 10 minutes at 300° C. and a pressure of about 1 MPa.

The first and second intrusion barrier layers 25 and 26 have a function of preventing eutectic material (AuSn) of the eutectic layer 15 from intruding into the ohmic electrode 23 during the thermocompression bonding. The present inventors have found that the use of Al as the material of the first intrusion barrier layer 25 and Ta as the material of the second intrusion barrier layer 26 is effective among other materials. The diffusion barrier layer 24 has a function of preventing Zn of AuZn of the ohmic electrode 23 from diffusing into the first and second intrusion barrier layers 25 and 26.

The atmosphere, bonding temperature and time of the thermocompression bonding are selected so that eutectic material can be melted, that the characteristics of the eutectic material are not changed (e.g., lowered bonding strength due to oxidation or the like) and that the support substrate 30 and device substrate 31 are bonded reliably.

Reference is made to FIG. 1F. After the support substrate 30 and device substrate 31 are bonded together, the semiconductor substrate 21 of GaAs is removed by, for example, wet etching. Etchant may be $NH_4OH$ containing etchant for example. The semiconductor substrate 21 may also be removed by dry etching or mechanical polishing. At least one of wet etching, dry etching and mechanical polishing and another method may be combined to remove the semiconductor substrate 21.

Figure 1D:
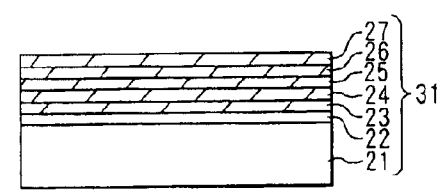
Figure 1G:
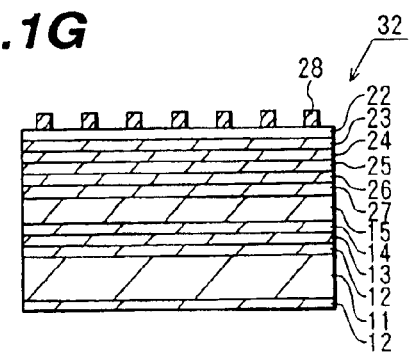

Reference is made to FIG. 1G. After the semiconductor substrate 21 is removed, a front electrode 28 is formed on the semiconductor light emitting structure 22 in ohmic contact with the surface layer of the semiconductor light emitting structure 22 exposed on the surface of the semiconductor light emitting device. The front electrode 28 is made of material such as AuSnNi and AuGeNi which can form ohmic contact with n-type semiconductor if this is the material of the surface layer of the semiconductor light emitting structure 22.

The front electrode 28 is formed by lift-off, for example. In lift-off, a photoresist layer is coated on the semiconductor light emitting structure 22 and exposed by using a photomask to form an opening of a desired electrode shape, electrode material is vapor-deposited and thereafter the photoresist layer together with the upper deposited metal layer is removed. As a method of vapor-depositing electrode material, resistance heating evaporation, EB method, sputtering or the like may be used.

With the processes described above, a semiconductor light emitting device 32 can be manufactured.

Description will be made on the merits of the Ti layer 13 and Ni layer 14 (ball-up preventing layer) included in the support substrate 30.

If the thermocompression bonding is performed for bonding the device substrate 31 and a support substrate not provided with the ball-up preventive structure, eutectic material of the eutectic layer 15 balls up during the thermocompression bonding so that the device substrate cannot be bonded horizontally (in parallel) to the support substrate. If the thermocompression bonding does not form a horizontal bonding, it becomes difficult to perform photolithography at a later process after the thermocompression bonding. For example, in the process described with reference to FIG. 1G, the surface coated with the photoresist film cannot be in tight contact with the photomask because of the ball-up phenomenon, so that it is difficult to form the surface electrode 28 having a desired shape and a size of 10 μm or smaller.

The influence of the ball-up phenomenon exists as long as the photolithography process is included, even if the electrode material layer 28 is vapor-deposited on the semiconductor light emitting structure 22, thereafter a resist pattern of a desired electrode shape is made using photoresist, and the unnecessary electrode region is removed by etching or the like. There is a shadow mask vapor deposition method well known as a simple electrode forming method. With this method, however, it is difficult to form an electrode having a size of 10 μm or smaller with a high precision. If the semiconductor light emitting device 32 is manufactured by using the support substrate 30 having the Ti layer 13 and Ni layer 14 (ball-up preventive layers), the above problem can be solved and the semiconductor light emitting device of a high quality can be manufactured.

Figure 2A:
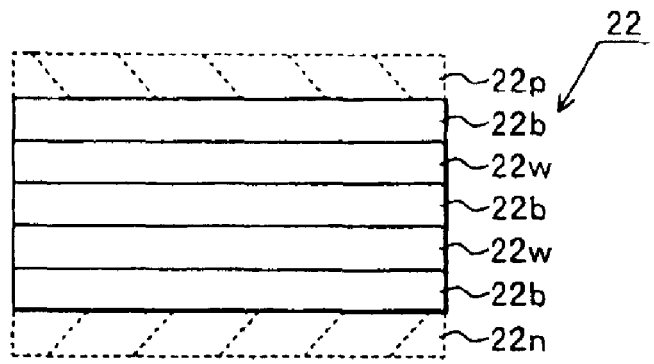
FIGS. 2A to 2C are cross sectional views illustrating the structure of a semiconductor light emitting layer.
Figure 2B:
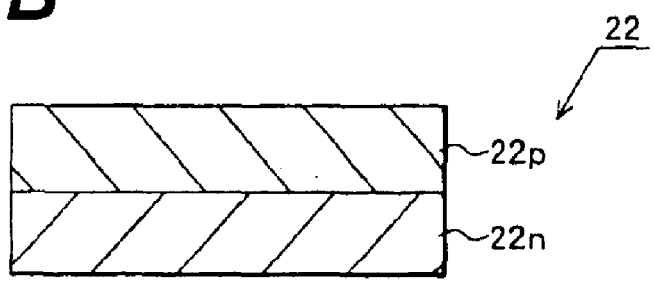
Figure 2C:
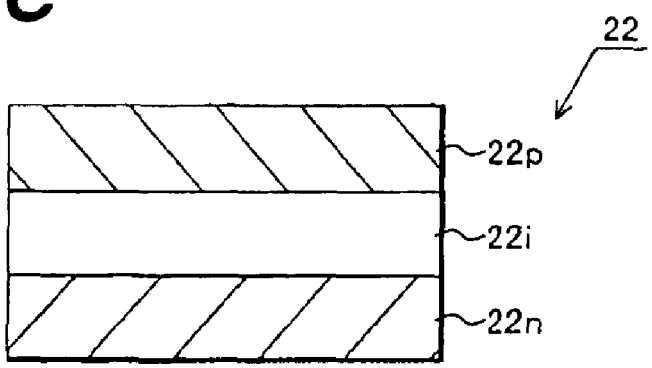

With reference to FIGS. 2A to 2C, description will be made on examples of the semiconductor light emitting structure 22 of the device substrate 31 shown in FIG. 1D.

Reference is made to FIG. 2A. The semiconductor light emitting structure 22 has the configuration that a potential barrier layers 22b and a potential well layer 22w are alternately laminated on a low resistivity n-type clad layer 22n, and a low resistivity p-type clad layer 22p is stacked on the uppermost potential barrier layer 22b. The lamination of the potential barrier layers 22b and potential well layers 22w constitutes a multiple quantum well structure. The number of quantum well layers 22w can be increased or decreased as desired.

Reference is made to FIG. 2B. The semiconductor light emitting structure 22 has the single hetero (SH) structure that on an n-type semiconductor layer 22n, a p-type semiconductor layer 22p having a different composition is stacked. The n-type semiconductor layer 22n and p-type semiconductor layer 22p each may be made of a plurality of sub layers. For example, low impurity concentration layers may be used for forming a pn junction, and high impurity concentration layers are formed on both sides of the low impurity concentration layer. Material having a large band gap may be used as the material of the high impurity concentration layer to form guide and clad layers.

Reference is made to FIG. 2C. The semiconductor light emitting structure 22 has the double hetero (DH) structure that on an n-type semiconductor layer 22n, an intrinsic (i) semiconductor layer 22i having a narrow band gap and a different composition is stacked, and on this intrinsic (i) semiconductor layer 22i, a p-type semiconductor layer 22p having a wide band gap and a different composition is stacked. A carrier confinement effect of confining electrons and holes in the (i) layer 22i can be obtained by disposing the n- and p-type semiconductor layers 22n and 22p having a wide band gap on both sides of the (i) layer 22i. Since the material having a wide band gap has generally a low reflactive index, a light confinement effect can also be obtained.

According to the method of manufacturing a semiconductor light emitting device described above, the ball-up of AuSn can be prevented when the support substrate 30 and device substrate 31 are bonded together, because the support substrate 30 includes the ball-up preventive layers (Ti layer 13 and Ni layer 14) under the AuSn eutectic layer 15.

If a support substrate not provided with the ball-up preventive layer is used, AuSn lumps having a height of about 10 to 30 $\mu$m are formed. The support substrate 30 provided with the ball-up preventive layers was used and lumps were not observed with an optical microscope. It can be considered from this that the ball-up preventive layers can prevent the ball-up perfectly. Even if some ball-up exist, the height of a lump is considered to be not more than 2 $\mu$m which is a recognition threshold value of an optical microscope.

It can be considered that the Ti layer 13 functions as a layer having a high adhesion or tight contact with the underlying Au layer 12. By forming the Ni layer 13 on the Ti layer 14, it can be expected that wettability of the eutectic layer formed on the Ni layer can be improved. Improvement on the wettability by the Ni layer 14 can be considered as preventing segregation of the eutectic material AuSn.

The Au layer not easy to be peeled off from the conductive substrate 11 can be formed by vapor-depositing Au on both sides of the conductive substrate and preforming an alloying process. By making alloy of the conductive substrate 11 and Au layer 12, the semiconductor light emitting device 32 can be formed which is excellent in tight contact, has a good ohmic contact, a long life time and a high reliability. During the processes of manufacturing a semiconductor light emitting device, durability in processes after the alloying process can be improved.

Zn in AuZn can be prevented from diffusing into the first and second intrusion barrier layers 25 and 26 during bonding of the support substrate 30 and device substrate 31 by forming the diffusion barrier layer 24 made of Ti—W-nitride on the p-side ohmic electrode 23 made of AuZn.

The diffusion preventing effect by the diffusion barrier layer results in, for example, a lowered contact resistance value. The present inventors have confirmed from the following experiment that the diffusion barrier layer prevents diffusion of Zn.

Two structures, one having no diffusion barrier (Ti—W-nitride) layer and the other having the diffusion barrier layer 24, were prepared. The one structure had the configuration that an AuZn layer of 200 nm thick was vapor-deposited on a p-InGaP substrate, and that an Al layer of 300 nm thick was vapor-deposited on the AuZn layer, and the alloying process was performed at 500° C. The other structure had the configuration that an AuZn layer of 200 nm thick was vapor-deposited on a p-InGaP substrate, that a diffusion barrier (Ti—W-nitride) layer of 100 to 200 nm thick was formed on the AuZn layer, and that an Al layer of 300 nm thick was vapor-deposited on the diffusion barrier layer, and the alloying process was performed at 500° C.

Contact resistance between the p-InGaP substrate and AuZn layer of the two structures was measured. The former structure had a contact resistance value of $2.7\times10^{-4}$ ($\Omega$cm$^2$), and the latter structure with the diffusion barrier layer had a contact resistance value of $5\times10^{-6}$ to $6\times10^{-5}$ ($\Omega$cm$^2$).

The contact resistance value of the structure with the diffusion barrier layer is smaller by one to two orders of magnitude. It can be judged that ohmic characteristics are better if the contact resistance value is smaller. It can therefore be judged that existence of the diffusion barrier layer realizes good ohmic contact characteristics, because the diffusion barrier (Ti—W-nitride) layer prevents diffusion of Zn.

By forming the first intrusion barrier layer 25 made of Al and the second intrusion barrier layer 26 made of Ta, it becomes possible to prevent eutectic material (AuSn) from intruding into the ohmic electrode 23 functioning as a reflection layer of the semiconductor light emitting device 32, during bonding of the support substrate 30 and device substrate 31, and to prevent a reflectance value from being lowered.

It can be considered that the two intrusion barrier layers can prevent almost perfectly the eutectic material (AuSn) from intruding into the ohmic electrode 23. AuSn is also used as the material of the n-side electrode. Sn functions also as an n-type dopant. If the ohmic electrode 23 is made of the p-side electrode (AuZn) and AuSn transmits through the intrusion barrier layer and reaches the AuZn layer, the ohmic characteristics are degraded, or in a worse case, a Schottky junction is formed. However, the experiment made by the present inventors using the intrusion barrier layers showed no change in the ohmic characteristics. It can therefore be considered that intrusion of AuSn into the ohmic electrode 23 can be prevented almost perfectly.

Because of these effects and reasons, the semiconductor light emitting device 32 having a high quality can be manufactured.

Additional remark will be given on the alloy process between the conductive substrate 11 and Au layer 12. The alloying process between the conductive substrate 11 and the Au layer 12 on the side to be bonded to the device substrate 31 is a more effective alloying process. The material of the electrode on the opposite surface may be different material such as Ti/TiN/Al since this electrode is used as a lead electrode for such as die bonding. However, the front and back electrodes are preferably made of the same material in order to simplify the process. Since the eutectic temperature of Au with Si is as low as about 400° C., it can be said that these materials are adequate materials in terms of mass production. For example, the eutectic temperature with Si is 600 to 800° C. for Pt, about 900° C. for Ni, and about 900° for Ti.

FIGS. 3A to 3F are schematic cross sectional views illustrating a method of manufacturing a semiconductor light emitting device according to a second embodiment.

Figure 3A:
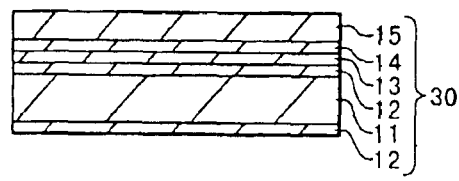
FIGS. 3A to 3F are cross sectional views illustrating a method of manufacturing a semiconductor light emitting device according to a second embodiment.

FIG. 3A shows the support substrate 30 whose structure and manufacture method have been described with reference to FIGS. 1A and 1B. This support substrate 30 is prepared by the processes shown in FIGS. 1A and 1B.

Figure 3B:
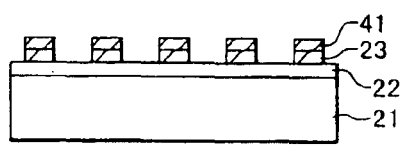

Reference is made to FIG. 3B. Similar to the first embodiment, a semiconductor substrate, e.g., a GaAs substrate, is prepared. On this semiconductor substrate 21, a semiconductor light emitting structure 22 is formed. By injecting current into the semiconductor light emitting structure 22, this structure emits light having a wavelength specific to the material of its semiconductor light emitting layer. As described with the first embodiment, the semiconductor light emitting structure 22 is made of, for example, a multiple quantum well structure, a simple (homo) pn junction, a double hetero (DH) structure, a single hetero (SH) structure or the like.

In a partial surface area of the semiconductor light emitting structure 22, an ohmic electrode 23 is formed. The material and forming method of the ohmic electrode 23 may be similar to those of the first embodiment.

Next, a first barrier (diffusion barrier) layer 41 is formed on the ohmic electrode 23 by using Ti—W-nitride for example. The first barrier layer 41 has a thickness of, for example, 100 to 200 nm and is required to be at least 100 nm. For example, a reactive sputtering method is used to form the first barrier layer. The first barrier layer 41 and ohmic electrode layer 23 are etched and patterned by using a resist pattern as a mask. A lift-off method may be used to pattern the ohmic electrode layer.

After patterning the first barrier layer 41 and ohmic electrode 23, an alloying process is performed to form good ohmic contact between the semiconductor light emitting structure 22 and ohmic electrode 23. For example, if the surface layer of the semiconductor light emitting structure 22 is made of p-AlGaInP and the ohmic electrode 23 is made of AuZn, heat treatment is performed at about 500° C. in a nitrogen atmosphere.

After the alloying process, a conductive reflection layer is formed. Al is vapor-deposited to form a metal reflection layer 42 on the first barrier layer 41 and on the semiconductor light emitting structure 22 where the first barrier layer (ohmic electrode 23) is not formed. The metal reflection layer 42 is made thicker than a total thickness of the ohmic electrode 23 and the first barrier layer 41 formed on the ohmic electrode 23. The thickness is preferably 600 nm to 1000 nm for example. The metal reflection layer 42 can be formed, for example, by EB method, resistance heating evaporation, sputtering or the like.

The metal reflection layer 42 has the structure that Al of the first intrusion barrier layer 25 of the semiconductor light emitting device 32 manufactured by the first embodiment method is also used as the reflection electrode. Namely, the metal reflection layer 42 of a manufactured semiconductor light emitting device has also a function of reflecting light emitted from the semiconductor light emitting structure 22 to improve the external light emission efficiency of the semiconductor light emitting device.

The metal reflection layer 42 made of Al can reflect incidence light at a reflectance of about 80% or higher if the wavelength of light emitted by the semiconductor light emitting structure 22 is near 650 nm. The metal reflection layer 42 made of Al can reflect light having a wavelength of 700 nm or shorter at a reflectance of about 80% or higher. Additional description of the metal reflection layer 42 will be later given.

Figure 3C:
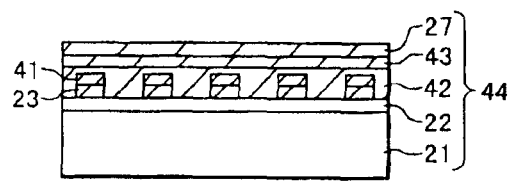

Reference is made to FIG. 3C. On the metal reflection layer 42, a second barrier (intrusion barrier) layer 43 is formed which is made of refractory metal such as Ta, Mo and W. The second barrier layer 43 has a thickness of 100 to 200 nm for example. The refractory metal such as Ta, Mo and W is hard to be vapor-deposited by resistance heating evaporation so that EB method or the like is used for example. By using the EB method, the second barrier layer 43 can be formed easily. The function of the second barrier layer 43 will be later described.

On the second barrier layer 43, a low resistance metal layer 27 is formed which is made of, for example, Au. A lamination structure of the semiconductor substrate 21, semiconductor light emitting structure 22, ohmic electrode 23, first barrier layer 41, metal reflection layer 42, second barrier layer 43 and metal layer 27 is called a device substrate 44.

Figure 3D:
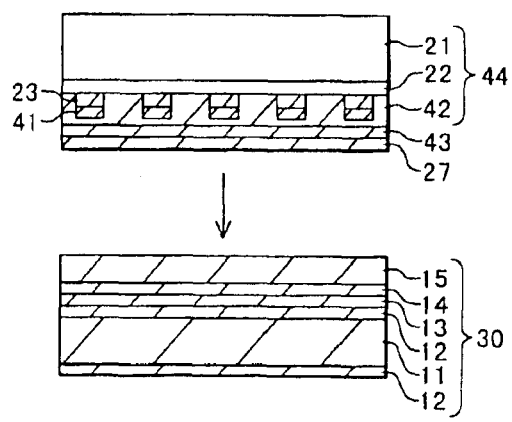

Reference is made to FIG. 3D. The support substrate 30 and device substrate 44 are bonded together by thermocompression bonding (hot press or metal bonding) for example. The atmosphere, bonding temperature and time during bonding are similar to those of the first embodiment described with reference to FIG. 1E.

The first barrier layer 41 has a function of preventing Zn of AuZn of the ohmic electrode 23 from diffusing into the metal reflection layer 42. If the first barrier layer 41 is not formed and the ohmic electrode 23 and metal reflection layer 42 contact each other in their main areas, Zn of AuZn of the ohmic electrode 23 diffuses into the metal reflection layer 42 and the ohmic characteristics between the semiconductor light emitting structure 22 and ohmic electrode 23 are degraded. Namely, the ohmic characteristics may be lost and the Schottky characteristics may appear.

The second barrier layer 43 has a function of preventing eutectic material (AuSn) of the eutectic layer 15 from intruding into the metal reflection layer 42. If the eutectic material (AuSn) intrudes into the metal reflection layer 42, the reflectance of the metal reflection layer 42 lowers.

It is not preferable to use Au as the material of the metal reflection layer 42. Au mixes with the eutectic material (AuSn) of the eutectic layer 15 and a reflectance is lowered, even if the second barrier layer 43 is formed. For example, a reflectance of a reflection layer made of single Au is 90% or higher if the light wavelength of a semiconductor light emitting device is near 650 nm, whereas a reflectance of an Au reflection layer mixed with AuSn is 60% or lower.

The reflection layer 42 is a metal reflection layer using metal because it must be electrically conductive.

Figure 3E:
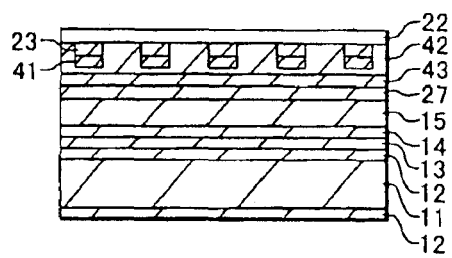

Reference is made to FIG. 3E. After the support substrate 30 and device substrate 44 are bonded together, the semiconductor substrate 21 of GaAs is removed. The removing method is similar to that of the first embodiment described with reference to FIG. 1F.

Figure 3F:
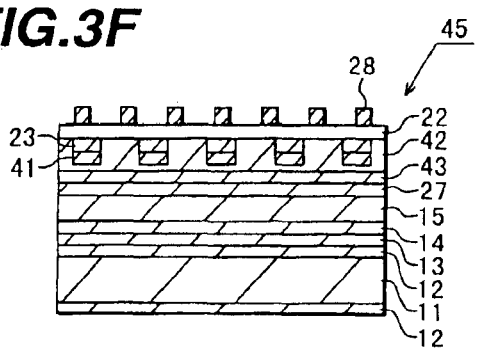

Reference is made to FIG. 3F. After the semiconductor substrate 21 is removed, a front electrode 28 is formed on the semiconductor light emitting structure 22, the front electrode forming ohmic contact with the n-type semiconductor 22n exposed on the surface of a semiconductor light emitting device. The material and forming method for the front electrode 28 are similar to those of the first embodiment described with reference to FIG. 1G.

With the above-described processed, a semiconductor light emitting device 45 can be manufactured.

The second embodiment has the effects common to those of the first embodiment. In addition, since the semiconductor light emitting device of the second embodiment has the second barrier layer 43 made of Ta or the like and formed on the metal reflection layer 42 made of Al, the eutectic material (AuSn) of the eutectic layer 15 can be prevented from intruding into the reflection layer when the support substrate 30 and device substrate 44 are bonded together. It is therefore possible to prevent the reflectance of the metal reflection layer 42 of a manufactured semiconductor light emitting device 45 from being lowered.

As described earlier, the semiconductor light emitting device 45 manufactured by the second embodiment manufacture method, has the structure that Al of the first intrusion barrier layer 25 of the semiconductor light emitting device 32 manufactured by the first embodiment is used also as the reflection electrode. Both a high reflectance and an excellent ohmic contact are therefore possible even if the ohmic electrode 23 is made of a low reflectance material other than AuZn and ohmic characteristics between Al and the semiconductor light emitting structure are poor.

From these effects and reasons, the semiconductor light emitting device 45 of a high quality can be manufactured.

Since arsenic is not contained in semiconductor light emitting devices manufactured by the semiconductor light emitting device manufacture methods of the first and second embodiments, there is only a small load on environments. For example, the invention is applicable to various display devices not desired to use environment load substance, such as a vehicle lamp, a portable telephone back light, an electric bulletin board light source.

Figure 4A:
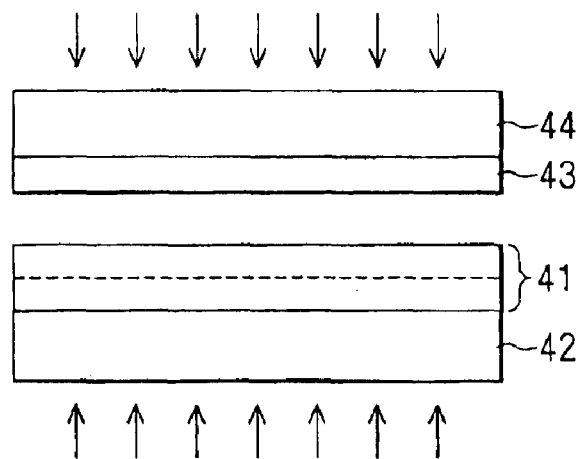
FIGS. 4A to 4C are cross sectional views illustrating the steps of manufacturing a conventional semiconductor light emitting device.
Figure 4B:
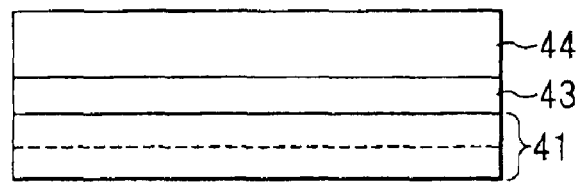
Figure 4C:
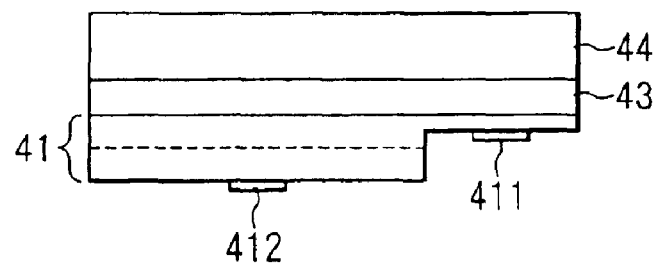

The present invention has been described in connection with the preferred embodiments. The invention is not limited only to the above embodiments. For example, instead of forming lead electrodes on both sides of a semiconductor light emitting device, they may be formed on one side as shown in FIG. 4C. In this case, an insulating substrate may be used as the support substrate. The semiconductor light emitting structure may have well-known various structures. The material of the ohmic electrode may be well-known various materials. It will be apparent to those skilled in the art that other various modifications, improvements, combinations, and the like can be made.

What is claim is:

1. A semiconductor light emitting device comprising:
   a substrate;
   a ball-up preventive layer formed on said substrate;
   a bonding layer made of eutectic material and formed on said ball-up preventive layer;
   a metal layer formed on said bonding layer;
   a barrier layer formed on said metal layer;
   a first electrode formed on or in parallel with said barrier layer;
   a semiconductor light emitting structure formed on a surface including an upper surface of said first electrode; and
   a second electrode formed on a partial surface of said semiconductor light emitting structure,
   wherein:
   eutectic material of said bonding layer forms eutectic with said metal layer to bond together said bonding layer and said metal layer;
   said ball-up preventive layer prevents ball-up of said bonding layer; and
   said barrier layer prevents a composition of a material of said first electrode from diffusing into said barrier layer and prevents the eutectic material of said bonding layer from intruding into said first electrode.

2. The semiconductor light emitting device according to claim 1, wherein said substrate is formed of a Si substrate doped with n- or p-type impurities.

3. The semiconductor light emitting device according to claim 1, wherein said substrate comprises a conductive substrate, and an Au layer alloyed with at least one surface of said conductive substrate.

4. The semiconductor light emitting device according to claim 1, wherein said ball-up preventive layer comprises a layer having high adhesion with said substrate and formed on said substrate, and a layer for improving wettability of said bonding layer formed on said layer having high adhesion with said substrate.

5. The semiconductor light emitting device according to claim 1, wherein said ball-up preventive layer includes a Ti layer formed on said substrate and an Ni layer formed on said Ti layer.

6. The semiconductor light emitting device according to claim 1, wherein said barrier layer includes a first barrier layer formed on said metal layer, capable of preventing the eutectic material of said bonding layer from intruding into said first electrode, and a second barrier layer formed on or in parallel with said first barrier layer, capable of preventing a composition of a material of said first electrode from diffusing out from said first electrode.

7. The semiconductor light emitting device according to claim 6, wherein said first barrier layer is made of an Al/Ta lamination, an Al/Mo lamination or an Al/W lamination and said second barrier layer is made of Ti—W-nitride.

8. The semiconductor light emitting device according to claim 6, wherein said first barrier layer and said first electrode are patterned in a same shape on said semiconductor light emitting structure.

9. The semiconductor light emitting device according to claim 8, wherein said second barrier layer has a higher reflectance than a reflectance of said first electrode, relative to light emitted from said semiconductor light emitting structure.

10. The semiconductor light emitting device according to claim 9, wherein said second barrier layer includes an Al layer in contact with said semiconductor light emitting structure.

* * * * *